United States Patent
Nagaura et al.

(10) Patent No.: US 10,519,558 B2
(45) Date of Patent: Dec. 31, 2019

(54) COPPER SULFATE, COPPER SULFATE SOLUTION, PLATING SOLUTION, METHOD FOR PRODUCING COPPER SULFATE, METHOD FOR PRODUCING SEMICONDUCTOR CIRCUIT BOARD, AND METHOD FOR PRODUCING ELECTRONIC APPARATUS

(71) Applicant: JX Nippon Mining & Metals Corporation, Tokyo (JP)

(72) Inventors: Tomota Nagaura, Ibaraki (JP); Masafumi Ishii, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/954,289

(22) Filed: Apr. 16, 2018

(65) Prior Publication Data

US 2018/0312989 A1  Nov. 1, 2018

(30) Foreign Application Priority Data

Apr. 28, 2017 (JP) ................. 2017-090247
Feb. 6, 2018 (JP) ................. 2018-019614

(51) Int. Cl.
  *C25D 3/38* (2006.01)
  *C25D 7/12* (2006.01)
  *H01L 21/288* (2006.01)
  *H01L 21/48* (2006.01)
  *H01L 21/768* (2006.01)

(52) U.S. Cl.
  CPC .............. *C25D 3/38* (2013.01); *C25D 7/123* (2013.01); *H01L 21/2885* (2013.01); *H01L 21/4846* (2013.01); *H01L 21/76879* (2013.01); *H01L 21/76898* (2013.01)

(58) Field of Classification Search
  CPC ............................ C01G 3/10; C01P 2006/80
  See application file for complete search history.

(56) References Cited

U.S. PATENT DOCUMENTS

| | | | |
|---|---|---|---|
| 7,695,527 B2* | 4/2010 | Shindo | C01G 3/003 23/297 |
| 7,887,603 B2* | 2/2011 | Shindo | C01G 3/10 23/295 R |
| 2005/0232849 A1* | 10/2005 | Shindo | C01G 3/10 423/557 |
| 2007/0053828 A1 | 3/2007 | Shindo | |
| 2011/0033369 A1* | 2/2011 | Shindo | C01G 3/10 423/557 |
| 2012/0174827 A1 | 7/2012 | Sekiguchi et al. | |

FOREIGN PATENT DOCUMENTS

| | | |
|---|---|---|
| JP | 3943583 B2 | 7/2007 |
| JP | 3987069 B2 | 10/2007 |
| KR | 20070086900 A | 8/2007 |
| KR | 20120109482 A | 10/2012 |

OTHER PUBLICATIONS

Korean Office Action for patent application No. 2018-0044744 dated Apr. 15, 2019, 6 pages.

* cited by examiner

*Primary Examiner* — Timothy C Vanoy
(74) *Attorney, Agent, or Firm* — Drinker Biddle & Reath LLP

(57) ABSTRACT

Copper sulfate which includes a Fe with a concentration of 0.08 ppm by mass or less.

9 Claims, No Drawings

COPPER SULFATE, COPPER SULFATE SOLUTION, PLATING SOLUTION, METHOD FOR PRODUCING COPPER SULFATE, METHOD FOR PRODUCING SEMICONDUCTOR CIRCUIT BOARD, AND METHOD FOR PRODUCING ELECTRONIC APPARATUS

BACKGROUND OF THE INVENTION

1. Field of the Invention

One or more embodiments of the present application relate to copper sulfate, a copper sulfate solution, a plating solution, a method for producing copper sulfate, method for producing a semiconductor circuit board, and a method for producing an electronic apparatus.

2. Description of the Related Art

Copper sulfate has been widely used as raw materials for an electrolytic solution, a pigment, an insecticide, an antiseptic, a mordant, a material for battery cells, a medical drug, an electroplating solution for electronic components, such as a semiconductor device, and the like.

For example, as copper sulfate capable of being applied to raw materials for an electrolytic solution, a pigment, an insecticide, an antiseptic, a mordant, a material for battery cells, a medical drug, an electroplating solution for electronic components, such as a semiconductor device, and the like, Japanese Patent No. 3,987,069 describes high purity copper sulfate having a purity of 99.99% by weight or more and a content of transition metals, such as Fe, Cr, and Ni, of 3 ppm by weight or less. Japanese Patent No. 3,943,583 describes high purity copper sulfate having a purity of 99.999% by weight or more.

However, according to the various demands in recent years, there is an increasing demand of copper sulfate having a further reduced impurity content, as compared to the high purity copper sulfate described in Japanese Patent Nos. 3,987,069 and 3,943,583.

For example, in the case where copper sulfate is used as a raw material of a copper plating bath, there is a problem that associated to the miniaturization of wiring, iron contained copper sulfate as a raw material for a copper plating bath decreases the conductivity of the copper film.

One or more embodiments of the present application provide copper sulfate having a reduced iron concentration, a copper sulfate solution, a plating solution, a method for producing copper sulfate, a method for producing a semiconductor circuit board, and a method for producing an electronic apparatus.

SUMMARY OF THE INVENTION

Copper sulfate according to one or more embodiments of the present application in one aspect has a Fe concentration of 0.08 ppm by mass or less.

A copper sulfate solution according to one or more embodiments of the present application in one aspect has a Fe concentration of 0.019 ppm by mass or less.

A copper sulfate solution according to one or more embodiments of the present application in another aspect has a Fe concentration of 0.016 ppm by mass or less.

A copper sulfate solution according to one or more embodiments of the present application in still another aspect has a Fe concentration of 0.012 ppm by mass or less.

A method for producing copper sulfate according to one or more embodiments of the present application in one aspect contains: concentrating by heating a copper sulfate raw material solution obtained by dissolving a copper raw material in concentrated sulfuric acid; cooling the copper sulfate raw material solution after concentrating by heating, at a cooling rate of 15° C./hr or less; and recovering a deposit deposited by the cooling in such a manner that a recovery ratio of the deposit becomes from 3 to 50%.

A plating solution according to one or more embodiments of the present application in one aspect has a Fe concentration of 0.018 ppm by mass or less.

A plating solution according to one or more embodiments of the present application in another aspect has a Fe concentration of 0.012 ppm by mass or less.

A method for producing a semiconductor circuit board according to one or more embodiments of the present application in one aspect contains performing copper plating by using the aforementioned plating solution.

A method for producing an electronic apparatus according to one or more embodiments of the present application in one aspect contains producing an electronic apparatus by using a semiconductor circuit board produced by the aforementioned method for producing a semiconductor circuit board.

DETAILED DESCRIPTION OF THE EMBODIMENTS

The copper sulfate according to one or more embodiments of the present application will be described in detail below.

The copper sulfate according to one or more embodiments of the present application has a Fe concertation of 0.08 ppm by mass or less, and is preferably copper sulfate having a Fe concentration of 0.05 ppm by mass or less. With a Fe concentration in the copper sulfate of 0.08 ppm by mass or less, for example, in the case where the copper sulfate according to one or more embodiments of the present application is used as a raw material of a copper plating solution, the deposition of Fe in the copper film, and the formation crystal defects generated by the deposition of Fe can be suppressed. As a result, the electric characteristics of a semiconductor wafer, a printed board, and a semiconductor integrated circuit board each having the copper film formed thereon, or a semiconductor integrated circuit and an electronic apparatus using them can be enhanced. The copper sulfate according to one or more embodiments of the present application may also be used as an electrolytic solution, a pigment, an insecticide, an antiseptic, a mordant, a material for battery cells, and the like, and there is a possibility that the copper sulfate can be used as a medical drug or the like.

The copper sulfate according to one or more embodiments of the present application may be copper sulfate that satisfies any one, any two, any three, any four, or five of the following items (3-1) to (3-5):

(3-1) an In concentration of 1.0 ppm by mass or less,
(3-2) a Tl concentration of 0.05 ppm by mass or less,
(3-3) a Sn concentration of 1.0 ppm by mass or less,
(3-4) an Ag concentration of 1.0 ppm by mass or less, and
(3-5) an Al concentration of 0.2 ppm by mass or less.

The copper sulfate according to one or more embodiments of the present application may further be copper sulfate that satisfies any one, any two, any three, any four, or five of the following items (4-1) to (4-5):

(4-1) an In concentration of 0.5 ppm by mass or less,
(4-2) a Tl concentration of 0.05 ppm by mass or less,
(4-3) a Sn concentration of 0.5 ppm by mass or less,
(4-4) an Ag concentration of 0.8 ppm by mass or less, and
(4-5) an Al concentration of 0.15 ppm by mass.

The copper sulfate according to one or more embodiments of the present application may further be copper sulfate that satisfies any one, any two, any three, any four, or five of the following items (5-1) to (5-5):
(5-1) an In concentration of 0.2 ppm by mass or less,
(5-2) a Tl concentration of 0.05 ppm by mass or less,
(5-3) a Sn concentration of 0.2 ppm by mass or less,
(5-4) an Ag concentration of 0.3 ppm by mass or less, and
(5-5) an Al concentration of 0.1 ppm by mass or less.

The copper sulfate according to one or more embodiments of the present application may further be copper sulfate that satisfies any one, any two, any three, any four, or five of the following items (6-1) to (6-5):
(6-1) an In concentration of 0.2 ppm by mass or less,
(6-2) a Tl concentration of 0.05 ppm by mass or less,
(6-3) a Sn concentration of 0.2 ppm by mass or less,
(6-4) an Ag concentration of 0.05 ppm by mass or less, and
(6-5) an Al concentration of 0.09 ppm by mass or less.

The copper sulfate according to one or more embodiments of the present application may further be copper sulfate that satisfies any one, any two, any three, any four, or five of the following items (7-1) to (7-5):
(7-1) an In concentration of 0.2 ppm by mass or less,
(7-2) a Tl concentration of 0.05 ppm by mass or less,
(7-3) a Sn concentration of 0.2 ppm by mass or less,
(7-4) an Ag concentration of 0.045 ppm by mass or less, and
(7-5) an Al concentration of 0.05 ppm by mass or less.

The concentrations of the elements in the copper sulfate according to one or more embodiments of the present application are measured according to the following manners.

(Analysis of Concentrations of Al, Na, K, Co, Cr, Ni, Zn, Ca, Mg, Cd, Mn, and Pb)

The concentrations of Al, Na, K, Co, Cr, Ni, Zn, Ca, Mg, Cd, Mn, and Pb in the copper sulfate are analyzed by measuring by an atomic absorption method after removing copper by an electrolytic method. The measurement apparatus used is a flameless atomic absorption device, Varian AA280Z/GTA120, produced by Agilent Technologies, Inc. (Zeeman atomic absorption spectrophotometer).

1 g of a specimen of copper sulfate and ultrapure water are placed in a 10 mL measuring flask, and the specimen is dissolved in ultrapure water. Thereafter, ultrapure water is added to the measuring flask until the bottom of the meniscus of the liquid in the measuring flask reaches the marked line of the measuring flask, so as to produce 10 mL of a copper sulfate aqueous solution. Thereafter, the resulting copper sulfate aqueous solution is subjected to controlled potential electrolysis for four hours with Pt electrodes (having a Pt concentration of 99.95% by mass or more) for an anode and a cathode (dual electrode system), so as to remove copper from the copper sulfate aqueous solution. Thereafter, the concentrations of Al, Na, K, Co, Cr, Ni, Zn, Ca, Mg, Cd, Mn, and Pb are measured with the aforementioned flameless atomic absorption device. The ultrapure water herein is water having an electroconductivity of 0.05882 μS/cm or less (with an electric resistivity (specific resistance) of 17.0 MΩ·cm or more). The precision balance used for the measurement of the mass of the specimen of copper sulfate is capable of measuring up to four places of decimal. The measured value includes up to four places of decimal. The concentration of the standard specimen of each of the elements for the flameless atomic absorption device is 1 ppb by mass. The aforementioned four-hour controlled potential electrolysis is performed in such a manner that electrolysis is performed at a current of 0.1 A for 30 minutes, then performed at a current of 0.15 A for 60 hours, and then performed at a current of 0.25 A for 150 minutes.

The concentrations of the elements are calculated by the following expression.

(concertation of designated element (ppm by mass))
=(concentration of designated element in copper sulfate aqueous solution (ppb by mass))×(mass of aqueous solution containing collected copper sulfate specimen dissolved therein (g))/(mass of collected copper sulfate specimen (g))×$10^{-3}$ (ppm by mass/ppb by mass)=(concentration of element in copper sulfate aqueous solution (ppb by mass))×10 (g)/1 (g)×$10^{-3}$ (ppm by mass/ppb by mass)

The mass of specimen of copper sulfate in the calculation expression is a value measured with the precision balance. The mass of the aqueous solution containing the collected specimen of copper sulfate dissolved therein is 10 g.

(Analysis of Concentrations of Sn and As)

The concentrations of Sn and As in the copper sulfate are analyzed by measuring by an atomic absorption method after separating Sn and As from copper by the following coprecipitation method. The measurement apparatus used is a flameless atomic absorption device, Varian AA280Z/GTA120, produced by Agilent Technologies, Inc. (Zeeman atomic absorption spectrophotometer).

2 g of a specimen of copper sulfate, ultrapure water, and 1 mL of a 5% by mass lanthanum nitrate hexahydrate ($La(NO_3)_3 \cdot 6H_2O$) aqueous solution are mixed, and the copper sulfate is dissolved to produce a copper sulfate aqueous solution. Aqueous ammonia is added to the copper sulfate aqueous solution to make pH of the copper sulfate aqueous solution of from 10 to 11. The hydroxide of copper formed by adding aqueous ammonia is dissolved as a complex of copper and ammonium ion by adding an excess amount of aqueous ammonia. Lanthanum becomes a hydroxide by the addition of aqueous ammonia, and is precipitated along with Sn and As. Thereafter, the precipitate thus formed is separated from the liquid with filter paper. A 50% by volume nitric acid aqueous solution (volume of concentrated nitric acid/volume of ultrapure water: 1/1, temperature: 50 to 80° C.) is added to the resulting precipitate to dissolve the precipitate, which is then dried. Thereafter, the product obtained by drying is dissolved in diluted hydrochloric acid prepared from ultrapure water and hydrochloric acid (volume of concentrated hydrochloric acid/volume of ultrapure water: 1/9), and the resulting solution is placed in a 20 mL measuring flask. The concentrated hydrochloric acid used is concentrated hydrochloric acid having a hydrogen chloride concentration of 36% by mass. Ultrapure water is added to the measuring flask until the bottom of the meniscus of the liquid in the measuring flask reaches the marked line of the measuring flask, so as to produce 20 mL of a solution for measurement. Thereafter, the resulting solution for measurement is measured for the concentrations of Sn and As with the aforementioned flameless atomic absorption device. The ultrapure water herein is water having an electroconductivity of 0.05882 μS/cm or less (with an electric resistivity (specific resistance) of 17.0 MΩ·cm or more). The precision balance used for the measurement of the mass of the specimen of copper sulfate is capable of measuring up to four places of decimal. The measured value includes up to four places of decimal. The concentration of the standard specimen of each of the elements for the flameless atomic absorption device is 50 ppb by mass.

The concentrations of the elements are calculated by the following expression.

(concertation of designated element (ppm by mass))
=(concentration of designated element in solution for measurement (ppb by mass))×(mass of solution for measurement (g))/(mass of copper sulfate specimen (g))×$10^{-3}$ (ppm by mass/ppb by mass)=(concentration of designated element in solution for measurement (ppb by mass))×20 (g)/2 (g)×$10^{-3}$ (ppm by mass/ppb by mass)

The mass of specimen of copper sulfate in the calculation expression is a value measured with the precision balance. The mass of the solution for measurement is 20 g.

(Analysis of Concentrations of Fe, In, Tl, Ag, and Ti)

The concentrations of Fe, In, Tl, Ag, and Ti in the copper sulfate can be measured by an ICP-MS method. Specifically, results obtained by measuring a specimen of copper sulfate diluted with 500 times of ultrapure water with an ICP mass spectroscope (SPW 9700), produced by SII NanoTechnology Inc.

The analysis of the concentrations of Fe, In, Tl, Ag, and Ti in the copper sulfate by an ICP-MS method can be performed in the following manner.

(1) 1 (g) of a specimen of copper sulfate is collected. The precision balance used for the measurement of the mass of copper sulfate is capable of measuring up to four places of decimal. The measured value includes up to four places of decimal.

(2) The specimen of copper sulfate in the item (1) and ultrapure water are placed in a 500 mL measuring flask, and thereafter ultrapure water (containing diluted nitric acid depending on necessity) is added to the measuring flask until the bottom of the meniscus of the liquid in the measuring flask reaches the marked line of the measuring flask, so as to produce a copper sulfate aqueous solution. The ultrapure water is water having an electroconductivity of 0.05882 μS/cm or less (with an electric resistivity (specific resistance) of 17.0 MΩ·cm or more). The electroconductivity of water can be measured according to JIS K0552 (1994). The ultrapure water can be produced, for example, by a commercially available ultrapure water producing equipment, such as an ultrapure water producing equipment, RFU 400 Series, produced by Advantec Toyo Kaisha, Ltd.

(3) The concentrations of Fe, In, Tl, Ag, and Ti in the copper sulfate aqueous solution produced in the item (2) are measured with an ICP mass spectroscope, such as an ICP mass spectroscope (SPW 9700), produced by SII NanoTechnology Inc. The resulting concentrations of Fe, In, Tl, Ag, and Ti in the copper sulfate aqueous solution are shown by CFe (ppb by mass), CIn (ppb by mass), CTl (ppb by mass), CAg (ppb by mass), and CTi (ppb by mass), respectively.

The concentrations of Fe, In, Tl, Ag, and Ti are calculated by the following expressions.

(Fe concentration (ppm by mass)=(Fe concentration in aqueous solution of collected copper sulfate specimen (ppb by mass))×(mass of aqueous solution of collected copper sulfate specimen (g))/(mass of collected copper sulfate specimen (g))×$10^{-3}$ (ppm by mass/ppb by mass)=CFe (ppb by mass)×(500 (g))×$10^{-3}$ (ppm by mass/ppb by mass)/1 (g)=0.500×CFe(ppm by mass)

(In concentration (ppm by mass)=(In concentration in aqueous solution of collected copper sulfate specimen (ppb by mass))×(mass of aqueous solution of collected copper sulfate specimen (g))/(mass of collected copper sulfate specimen (g))×$10^{-3}$ (ppm by mass/ppb by mass)=CIn (ppb by mass)×(500 (g))×$10^{-3}$ (ppm by mass/ppb by mass)/1 (g)=0.500×CIn (ppm by mass)

(Tl concentration (ppm by mass)=(Tl concentration in aqueous solution of collected copper sulfate specimen (ppb by mass))×(mass of aqueous solution of collected copper sulfate specimen (g))/(mass of collected copper sulfate specimen (g))×$10^{-3}$ (ppm by mass/ppb by mass)=CTl (ppb by mass)×(500 (g))×$10^{-3}$ (ppm by mass/ppb by mass)/1 (g)=0.500×CTl (ppm by mass)

(Ag concentration (ppm by mass)=(Ag concentration in aqueous solution of collected copper sulfate specimen (ppb by mass))×(mass of aqueous solution of collected copper sulfate specimen (g))/(mass of collected copper sulfate specimen (g))×$10^{-3}$ (ppm by mass/ppb by mass)=CAg (ppb by mass)×(500 (g))×$10^{-3}$ (ppm by mass/ppb by mass)/1 (g)=0.500×CAg(ppm by mass)

(Ti concentration (ppm by mass)=(Ti concentration in aqueous solution of collected copper sulfate specimen (ppb by mass))×(mass of aqueous solution of collected copper sulfate specimen (g))/(mass of collected copper sulfate specimen (g))×$10^{-3}$ (ppm by mass/ppb by mass)=CTi (ppb by mass)×(500 (g))×$10^{-3}$ (ppm by mass/ppb by mass)/1 (g)=0.500×CTi(ppm by mass)

The mass of specimen of copper sulfate in the calculation expressions is a value measured with the precision balance, The mass of the solution for measurement is 500 g.

(Analysis of Concentration of Cl)

The Cl concentration (chloride ion concentration) is measured with an ion chromatograph. Specifically, the measurement is performed with an ion chromatograph (Model ICS-1500), produced by Dionex Corporation.

The analysis of the concentration of Cl in the copper sulfate by an ion chromatograph can be performed in the following manner.

(1) 1 (g) of a specimen of copper sulfate is collected. The precision balance used for the measurement of the mass of copper sulfate is capable of measuring up to four places of decimal. The measured value includes up to four places of decimal.

(2) The specimen of copper sulfate in the item (1) and ultrapure water are placed in a 100 mL measuring flask, and thereafter ultrapure water is added to the measuring flask until the bottom of the meniscus of the liquid in the measuring flask reaches the marked line of the measuring flask, so as to produce a copper sulfate aqueous solution. The ultrapure water is water having an electroconductivity of 0.05882 μS/cm or less (with an electric resistivity (specific resistance) of 17.0 MΩ·cm or more). The electroconductivity of water can be measured according to JIS K0552 (1994). The ultrapure water can be produced, for example, by a commercially available ultrapure water producing equipment, such as an ultrapure water producing equipment, RFU 400 Series, produced by Advantec Toyo Kaisha, Ltd.

(3) The concentration of Cl in the copper sulfate aqueous solution produced in the item (2) is measured with an ion chromatograph (Model ICS-1500), produced by Dionex Corporation. The resulting concentration of Cl in the copper sulfate aqueous solution is shown by CCl (ppb by mass).

The concentration of Cl in the copper sulfate is calculated by the following expression.

(Cl concentration (ppm by mass)=(Cl concentration in aqueous solution of collected copper sulfate specimen (ppb by mass))×(mass of aqueous solution of collected copper sulfate specimen (g))/(mass of collected copper sulfate specimen (g))×$10^{-3}$ (ppm by mass/ppb by mass)=CCl (ppb by mass)×(100 (g))×$10^{-3}$ (ppm by mass/ppb by mass)/1 (g)=0.100×CCl(ppm by mass)

The mass of specimen of copper sulfate in the calculation expressions is a value measured with the precision balance. The mass of the solution for measurement is 100 g.

The copper sulfate according to one or more embodiments of the present application may have a concentration of metal impurities other than Cu of 30 ppm by mass or less in total, 25 ppm by mass or less in total in another embodiment, 20 ppm by mass or less in total in still another embodiment, and 15 ppm by mass or less in total in still further another embodiment.

In one or more embodiments of the present application, the "concentrations of metal impurities other than Cu in total" is obtained in such a manner that Na, K, Co, Cr, Ni, Zn, Al, Ca, Mg, Cd, Mn, Pb, Sn, As, Cl, Fe, Ag, Tl, Ti, and In are analyzed, and the total of the concentrations of the elements obtained through the analysis is designated as the total of concentrations of metal impurities other than Cu.

The concentrations of Fe, In, Tl, Ag, and Sn(ppm by mass) in the copper sulfate are measured in the same manner as described above. The other elements described above are also measured in the same manner as described above.

The total organic carbon (TOC) concentration in the copper sulfate is preferably 10 ppm by mass or less, more preferably 5 ppm by mass or less, more preferably 1 ppm by mass or less, and further preferably 0.1 ppm by mass or less. The TOC concentration in the copper sulfate may be measured with a total organic carbon meter (TOC-V), produced by Shimadzu Corporation. The measurement of the total organic carbon is performed with a copper sulfate aqueous solution obtained by dissolving a specimen of copper sulfate with ultrapure water (water having an electric resistivity (specific resistance) of 17.0 MΩ·cm or more) to make a copper concentration in the copper sulfate aqueous solution of from 25 to 50 g/L. The total organic carbon (TOC) concentration in the copper sulfate is calculated by the following expression.

(total organic carbon concentration (ppm by mass))=
(total organic carbon concentration in aqueous solution of collected copper sulfate specimen (ppb by mass)×(mass of aqueous solution of collected copper sulfate specimen (g)/(mass of collected copper sulfate specimen (g))×$10^{-3}$
(ppm by mass/ppb by mass)

The copper sulfate according to one or more embodiments of the present application may contain anhydrous copper sulfate and/or a hydrate of copper sulfate. Examples of the hydrate of copper sulfate include copper sulfate monohydrate, copper sulfate trihydrate, and copper sulfate pentahydrate. The copper sulfate according to one or more embodiments of the present application may contain a known hydrate of copper sulfate. In the description herein, the scope of claim, and the abstract, the term "copper sulfate" used is a concept that includes anhydrous copper sulfate and/or hydrates of copper sulfate.

The copper sulfate according to one or more embodiments of the present application may have a concentration of copper sulfate (which is a concentration of copper sulfate pentahydrate assuming that the copper sulfate is wholly copper sulfate pentahydrate) of 99.9% by mass or more and 99.999% by mass or less, 99.9% by mass or more and 99.995% by mass or less in another embodiment, 99.9% by mass or more and 99.992% by mass or less in still another embodiment, 99.9% by mass or more and 99.99% by mass or less in still further another embodiment, and 99.9% by mass or more and less than 99.99% by mass in still further another embodiment.

The concentration of copper sulfate is a result of evaluation by the following expression.

The copper concentration in a specimen of copper sulfate is measured by a sodium thiosulfate titration method.

The measurement method of the copper concentration (sodium thiosulfate titration method) is performed in the following manner.

A designated amount of a specimen of copper sulfate is collected and dissolved in ultrapure water to produce a copper sulfate aqueous solution having a concentration of copper sulfate of 255 g/L. The precision balance used for the measurement of the mass of the specimen of copper sulfate is capable of measuring up to four places of decimal. The ultrapure water herein is water having an electroconductivity of 0.05882 µS/cm or less (with an electric resistivity (specific resistance) of 17.0 MΩ·cm or more). The measured value includes up to four places of decimal. Thereafter, the operations of the following items (1) and (2) are performed.

(1) 2 mL of the copper sulfate aqueous solution is collected, to which an excess amount of potassium iodide is added.

The following reaction proceeds by adding potassium iodide to the copper sulfate aqueous solution.

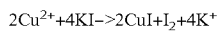
$2Cu^{2+}+4KI \rightarrow 2CuI+I_2+4K^+$ (2) The measurement is performed by titrating the amount of $I_2$ generated in the reaction in (1) with sodium thiosulfate. Specifically, the titration is performed until the violet color of iodine disappears to form a white turbid solution. The amount (molar amount) of sodium thiosulfate used for the titration is calculated.

$I_2+2Na_2S_2O_3 \rightarrow Na_2S_4O_6+2NaI$

It is assumed that the specimen of copper sulfate contains the same amount (molar amount) of copper as the amount of sodium thiosulfate used in the titration.

The copper concentration is measured by the following expressions.

(mass of copper contained in copper sulfate specimen (g))=(amount of copper contained in copper sulfate specimen (mol))×(atomic weight of copper (g/mol))=(amount of sodium thiosulfate required for titrating iodine ($I_2$) (mol))×(atomic weight of copper (g/mol))

(mass of copper sulfate pentahydrate contained in copper sulfate specimen (g))=(mass of copper contained in copper sulfate specimen (g)× 3.9292009

(assuming that the copper sulfate is wholly copper sulfate pentahydrate)

(concentration of copper sulfate (% by mass))=(mass of copper sulfate pentahydrate contained in copper sulfate specimen (g))/(mass of copper sulfate specimen (g))×100(%)=(mass of copper in copper sulfate specimen (g)×3.9292009/(mass of copper sulfate specimen (g))×100(%)

The method for producing copper sulfate according to one or more embodiments of the present application will be described.

A raw material containing copper and a concentrated sulfuric acid aqueous solution are heated in a reaction vessel under stirring to dissolve the raw material containing copper in the concentrated sulfuric acid aqueous solution, thereby providing a copper sulfate raw material solution, The stirring means is not particularly limited, and for example, the solution can be stirred by blowing air therein.

The raw material containing copper used may be commercially available copper sulfate crystals (concentration: 95 to 99.9% by mass). The copper sulfate crystals contain impurities, such as Na, Mg, Al, Ca, In, Sn, Ag, and Fe. In alternative, a solution obtained by dissolving electrolytic copper having a purity of 99.99% or more in an aqueous solution of concentrated sulfuric acid may also be used as the raw material containing copper. The concentrated sulfuric acid used may be commercially available concentrated sulfuric acid (sulfuric acid concentration: 95 to 99.9% by mass). Water used in the aqueous solution of concentrated sulfuric acid is preferably ultrapure water. The ultrapure water preferably has an electric resistivity of 15 MΩ·cm or more. This is because the use of ultrapure water having an electric resistivity of 15 MΩ·cm or more may reduce the impurities, such as Na, Mg, Al, Ca, In, Sn, Ag, and Fe in the aqueous solution of concentrated sulfuric acid in some cases, and may decrease the concentrations of elements, such as Fe, in the resulting copper sulfate in some cases. The electric resistivity of the ultrapure water is more preferably 15.5 MΩ·cm or more, more preferably 16.0 MΩ·cm or more, more preferably 16.5 MΩ·cm or more, and more preferably 17.0 MΩ·cm or more.

Subsequently, by heating the copper sulfate raw material solution, for example, to from 40 to 100° C., preferably approximately 100° C., water in the copper sulfate raw material solution is evaporated, and the copper sulfate raw material solution is concentrated until the copper concentration thereof becomes, for example, from 100 to 250 g/L. The concentrated copper sulfate raw material solution is then gradually cooled in the reaction vessel, and thereby crystals of copper sulfate (for example, copper sulfate pentahydrate) can be deposited.

In the cooling step, it is necessary to control precisely the cooling temperature until the temperature of the copper sulfate raw material solution after concentrating by heating becomes the cooling completion temperature, so as to make the appropriate cooling rate. Specifically, a lower cooling rate may provide a condition closer to the equilibrium, providing a tendency that the impurities are hardly contained in the deposited copper sulfate, but the impurities remain in the copper sulfate raw material solution. Accordingly, with a lower cooling rate, the concentrations of elements other than the elements (Cu, S, O, and H) constituting copper sulfate pentahydrate, such as aluminum, in the deposited copper sulfate can be decreased.

Specifically, the cooling rate of the copper sulfate raw material solution (i.e., the rate of decreasing the temperature of the copper sulfate raw material solution) until the temperature of the copper sulfate raw material solution under concentrating by heating (for example, 100° C.) becomes the cooling completion temperature is 15° C./hr or less, more preferably 10° C./hr or less, further preferably 7° C./hr or less, and still further preferably 5° C./hr or less. The cooling means is not particularly limited, and for example, such cooling methods as water cooling, gradual cooling, air cooling, and cooling with a heat exchanger may be utilized.

A deposit of copper sulfate is obtained from the copper sulfate raw material solution through the cooling step. The resulting copper sulfate contains copper sulfate pentahydrate as a major component in many cases. The resulting deposit of copper sulfate is separated by solid-liquid separation, dried, then pneumatically conveyed, and packaged individually, and thus the copper sulfate (crystal product) according to one or more embodiments of the present application is obtained.

In the cooling step, the recovery condition of the deposit of copper sulfate is preferably regulated. Specifically, the deposit that is deposited in the initial state in the cooling step is selectively recovered, and thereby the deposit of copper sulfate having a smaller amount of impurities can be recovered. More specifically, the deposit of copper sulfate is preferably recovered in such a manner that the recovery ratio of the deposit deposited by cooling becomes from 3 to 50%, more preferably from 5 to 35%, and further preferably from 5 to 25%. The recovery ratio can be evaluated by the following expression.

(recovery ratio (%))=(copper concentration in original copper sulfate aqueous solution (g/L))−(copper concentration in copper sulfate aqueous solution at stoppage of deposition of copper sulfate (g/L))/(copper concentration in original copper sulfate aqueous solution (g/L×100))

The method for making the recovery ratio of the deposit of copper sulfate in a range of from 3 to 50% is preferably, for example, a method of completing the recovery of the deposit of copper sulfate at the time when the temperature of the copper sulfate aqueous solution at the recovery of copper sulfate (i.e., the cooling completion temperature) becomes from 50 to 90° C., more preferably from 50 to 80° C.

The copper sulfate solution according to one or more embodiments of the present application can be obtained by adding a solvent, such as ultrapure water, to the copper sulfate (crystal product) according to one or more embodiments of the present application, and dissolving the copper sulfate in the solvent. Examples of the solvent for dissolving the copper sulfate include water, one or plural organic solvents, one or plural inorganic solvents, and a solvent containing one or more selected from the group consisting of water, one or plural organic solvents, and one or plural inorganic solvents. The organic solvent used may be an alcohol, an aromatic hydrocarbon, a fatty acid, a linear hydrocarbon, a cyclic hydrocarbon, an organic acid, or the like. The inorganic solvent used may be an inorganic acid, such as sulfuric acid, hydrochloric acid, nitric acid, and hydrofluoric acid. In the case where water is used as the solvent, a copper sulfate aqueous solution can be obtained.

Ultrapure water that is used for the copper sulfate aqueous solution preferably has an electric resistivity of 15.0 MΩ·cm or more, more preferably 15.5 MΩ·cm or more, more preferably 16.0 MΩ·cm or more, more preferably 16.5 MΩ·cm or more, and more preferably 17.0 MΩ·cm or more. This is because the use of ultrapure water having an electric resistivity of 15 MΩ·cm or more may decrease the concentrations of impurities, such as Na, Mg, Al, Ca, In, Sn, Ag, and Fe in the copper sulfate aqueous solution in some cases.

The copper sulfate solution may have a copper concentration of approximately from 50 to 100 g/L. The copper sulfate solution preferably has a Fe concentration of 0.019 ppm by mass or less, more preferably 0.016 ppm by mass or less, and further preferably 0.012 ppm by mass or less. The copper sulfate solution preferably has a TOC concentration of 1.20 ppm by mass or less. The copper sulfate solution more preferably has a TOC concentration of 1.10 ppm by mass or less, further preferably 1.0 ppm by mass or less, and still further preferably 0.9 ppm by mass or less.

A plating solution can be produced by using the copper sulfate or the copper sulfate solution described above. The plating solution according to one or more embodiments of the present application has a Fe concentration of 0.018 ppm by mass or less, and preferably 0.012 ppm by mass or less.

The plating solution according to one or more embodiments of the present application may satisfy any one, any two, any three, any four, or five of the following items (8-1) to (8-5):

(8-1) an In concentration of 0.2 ppm by mass or less,
(8-2) a Tl concentration of 0.01 ppm by mass or less,
(8-3) a Sn concentration of 0.3 ppm by mass or less,
(8-4) an Ag concentration of 0.4 ppm by mass or less, and (8-5) an Al concentration of 0.04 ppm by mass or less.

The plating solution according to one or more embodiments of the present application may further satisfy any one, any two, any three, any four, or five of the following items (9-1) to (9-5):

(9-1) an In concentration of 0.13 ppm by mass or less,
(9-2) a Tl concentration of 0.01 ppm by mass or less,
(9-3) a Sn concentration of 0.2 ppm by mass or less,
(9-4) an Ag concentration of 0.3 ppm by mass or less, and
(9-5) an Al concentration of 0.020 ppm by mass or less.

The plating solution according to one or more embodiments of the present application may further satisfy any one, any two, any three, any four, or five of the following items (10-1) to (10-5):

(10-1) an In concentration of 0.08 ppm by mass or less,
(10-2) a Tl concentration of 0.01 ppm by mass or less,
(10-3) a Sn concentration of 0.1 ppm by mass or less,
(10-4) an Ag concentration of 0.2 ppm by mass or less, and
(10-5) an Al concentration of 0.013 ppm by mass or less.

The plating solution according to one or more embodiments of the present application preferably has a copper concentration of from 50 to 100 g/L, and more preferably from 50 to 90 g/L.

The plating solution according to one or more embodiments of the present application can be prepared by using the aforementioned copper sulfate having a purity of 99.9% by mass or more and 99.999% by mass or less, and copper plating can be performed by using the plating solution. According to one or more embodiments of the present application, an electronic apparatus can be produced by using a semiconductor circuit board produced by performing copper plating by using the plating solution.

EXAMPLES

While examples of one or more embodiments of the present application are described below along with comparative examples, the examples are provided for better understanding of one or more embodiments of the present application and the advantages thereof, but do not intend to restrict one or more embodiments of the present application.

As a copper raw material, commercially available copper sulfate (Cu: 99% or more, Na: 10 ppm, Mg: 1.5 ppm, Al: 4.5 ppm, Ca: 3.9 ppm, In: 5.6 ppm, Sn: 10 ppm, Ag: 3.5 ppm, Fe: 8.5 ppm) was mixed with ultrapure water having an electric resistivity of 15 MΩ·cm or more, and stirred under heating at 100° C. to produce a copper sulfate raw material solution. Thereafter, the copper sulfate raw material solution was transferred to a concentrating vessel and retained at a temperature of 100° C. for from 2 to 10 hours to evaporate water in the copper sulfate raw material solution, thereby concentrating the solution until the copper concentration thereof becomes from 150 to 250 g/L. The copper sulfate raw material solution having been concentrated by heating was transferred to a crystallizing vessel, and in the crystallizing vessel, cooled to a temperature shown in Table 1 at a cooling rate shown in Table 1. The treated product obtained by cooling was subjected to solid-liquid separation by suction filtration, and thus a deposit of copper sulfate (copper sulfate pentahydrate) was obtained. The deposit of copper sulfate was dried to provide a crystal product of the copper sulfate of Examples 1 to 6 and Comparative Examples 1 to 3.

The copper sulfate according to Examples 1 to 6 and Comparative Examples 1 to 3 was measured for the concentrations of Na, K, Co, Cr, Ni, Zn, Al, Ca, Mg, Cd, Mn, Pb, Sn, As, Cl, Fe, Ag, Tl, Ti, and In in copper sulfate and the concentration of copper sulfate by the aforementioned measurement methods. The impurity elements in copper sulfate were assumed to be Na, K, Co, Cr, Ni, Zn, Al, Ca, Mg, Cd, Mn, Pb, Sn, As, Cl, Fe, Ag, Tl, Ti, and In, and the total of the analysis results of the concentrations of these elements was designated as the total concentration of impurities other than Cu. The measurement results of the concentrations of Fe, Al, In, Tl, Sn, and Ag in copper sulfate, the total concentration of impurities, and the concentration of total organic carbon (TOC) in the copper sulfate according to Examples 1 to 6 and Comparative Examples 1 to 3 are shown in Table 1.

Copper sulfate aqueous solutions were produced with the copper sulfate according to Examples 1 to 6 and Comparative Examples 1 to 3, to which the prescribed additives shown later were added to produce electroplating solutions. An $SiO_2$ film was accumulated on a silicon wafer by a chemical vapor deposition (CVD) method. A Ta layer as a barrier layer was provided on the surface of the $SiO_2$ film by sputtering. A Cu seed layer having a thickness of 80 nm was further formed on the Ta layer by sputtering, and then a copper film having a thickness of 30 μm was formed by copper electroplating. A specimen of 45 g was collected from each of the copper sulfate according to Examples 1 to 6 and Comparative Examples 1 to 3, and the specimen was dissolved with ultrapure water (having an electric resistivity of 17 MΩ·cm or more) to prepare 200 mL of a copper sulfate aqueous solution (which had the same ratio of copper sulfate and the other liquids as the electroplating bath shown below). The copper sulfate aqueous solution was measured for the Fe concentration and the total organic carbon concentration therein by the aforementioned measurement methods, in which the specimen of copper sulfate was replaced with the copper sulfate aqueous solution. The results are shown in Table 2.

The electroplating bath and the electroplating conditions are as follows.
(Electroplating Bath and Electroplating Conditions)
Electroplating Bath A plating bath having the following composition was used as the electroplating bath.

Copper sulfate (added as copper sulfate pentahydrate, copper: 57.3 g/L) concentration: 225 g/L
Sulfuric acid concentration: 55 g/L
Chloride ion: 60 ppm
Polyethylene glycol (average molecular weight: 10,000) concentration: 500 mg/L
Bis(3-sulfopropyl) disulfide (SPS) concentration: 20 mg/L
Janus green concentration: 1 mg/L
The solvent used as ultrapure water (having an electric resistivity of 15 MΩ·cm or more).
Electroplating Conditions The plating conditions were a plating bath temperature of 40° C., a cathode current density of 2.0 A/dm$^2$, an anode current density of 2.0 A/dm$^2$, and a plating time of from 70 to 90 minutes.

The copper film was evaluated for platability by measuring the electric resistance by the four-probe method. In the evaluation of platability, the case where the electric resistance was less than 0.020×10$^{-4}$ Ω/cm was evaluated as "A", the case where the electric resistance was 0.020×10$^{-4}$ Ω/cm or more and less than 0.040×10$^{-4}$ Ω/cm was evaluated as "B", and the case where the electric resistance was 0.040×10$^{-4}$ Ω/cm or more was evaluated as "C", The results are shown in Table 2.

The recovery ratio of the copper sulfate was evaluated according to the following.

(recovery ratio (%))=(copper concentration in original copper sulfate aqueous solution (g/L))−(copper concentration in copper sulfate aqueous solution at stoppage of deposition of copper sulfate (g/L))/(copper concentration in original copper sulfate aqueous solution (g/L))

The results are shown in Table 1.

produced according to the methods for producing high purity copper sulfate described in Japanese Patent No. 3,987,069 for Comparative Example 2 and Japanese Patent No. 3,943,583 for Comparative Example 3. In both Comparative Examples 2 and 3, the iron concentration was larger than in Examples 1 to 6 although the copper sulfate concentration was large, and thus the copper film had a large electric resistance, providing inferior platability to Examples 1 to 6.

TABLE 1

|  | Cooling rate of copper sulfate raw material solution from 100° C. to cooling completion temperature (° C./hr) | Cooling completion temperature (° C.) | Recovery ratio (%) | Copper sulfate concentration (% by mass) | Impurity concentration in copper sulfate (ppm by mass) |  |  |  |  |  | Total concentration | TOC (ppm by mass) |
|---|---|---|---|---|---|---|---|---|---|---|---|---|
|  |  |  |  |  | Fe | Al | In | Tl | Sn | Ag |  |  |
| Example 1 | 5° C./hr | 76 | 5 | 99.999 | 0.02 | 0.02 | <0.05 | <0.05 | <0.05 | 0.15 | 1.52 | 0.18 |
| Example 2 | 7° C./hr | 73 | 8 | 99.999 | 0.03 | 0.05 | 0.35 | <0.05 | 0.30 | 0.60 | 2.36 | 0.89 |
| Example 3 | 10° C./hr | 67 | 16 | 99.995 | 0.044 | 0.07 | 0.42 | <0.05 | 0.61 | 0.83 | 17.02 | 3.33 |
| Example 4 | 10° C./hr | 65 | 18 | 99.99 | 0.05 | 0.09 | 0.52 | <0.05 | 0.71 | 1.10 | 21.35 | 3.81 |
| Example 5 | 10° C./hr | 60 | 25 | 99.99 | 0.06 | 0.11 | 0.59 | <0.05 | 0.79 | 1.15 | 25.98 | 4.32 |
| Exampel 6 | 15° C./hr | 53 | 32 | 99.99 | 0.08 | 0.15 | 0.66 | <0.05 | 0.91 | 1.55 | 28.13 | 5.26 |
| Comparative Example 1 | 15° C./hr | 0 | 75 | 99.97 | 3.00 | 2.30 | 1.50 | <0.05 | 2.60 | 2.50 | 35.56 | 11.45 |
| Comparative Example 2 | 15° C./hr | 25 | 64 | 99.999 | 0.09 | 0.09 | 0.10 | <0.05 | 0.50 | <0.01 | 1.70 | 5.72 |
| Comparative Example 3 | 15° C./hr | 25 | 55 | 99.99 | 0.05 | 0.10 | 0.11 | <0.05 | 0.60 | 0.04 | 3.41 | 6.90 |

TABLE 2

|  | Impurity concentration in copper sulfate solution (ppm by mass) |  |  |  |  |  | TOC (ppm by mass) | Platability | Electric resistance ($^{-4}$ Ω cm) |
|---|---|---|---|---|---|---|---|---|---|
|  | Fe | Al | In | Tl | Sn | Ag |  |  |  |
| Example 1 | 0.005 | 0.005 | <0.01 | <0.01 | <0.01 | 0.034 | 0.04 | A | 0.0221 |
| Example 2 | 0.007 | 0.011 | 0.079 | <0.01 | 0.068 | 0.135 | 0.20 | B | 0.0235 |
| Example 3 | 0 010 | 0.016 | 0.095 | <0.01 | 0.137 | 0.187 | 0.75 | B | 0.0321 |
| Example 4 | 0.011 | 0.020 | 0.117 | <0.01 | 0.160 | 0.248 | 0.86 | B | 0.0333 |
| Example 5 | 0.014 | 0.025 | 0.133 | <0.01 | 0.178 | 0.259 | 0.97 | B | 0.0349 |
| Example 6 | 0.018 | 0.034 | 0.149 | <0.01 | 0.205 | 0.349 | 1.18 | B | 0.0362 |
| Comparative Example 1 | 0.675 | 0.518 | 0.338 | <0.01 | 0.585 | 0.563 | 2.58 | C | 0.0704 |
| Comparative Example 2 | 0.020 | 0.020 | 0.023 | <0.01 | 0.113 | <0.002 | 1.29 | C | 0.0401 |
| Comparative Example 3 | 0.113 | 0.023 | 0.025 | <0.01 | 0.135 | 0.009 | 1.55 | C | 0.0422 |

In Examples 1 to 6, in which the cooling rate and the recovery ratio on depositing copper sulfate pentahydrate from the copper sulfate raw material solution were controlled to adequate ranges, the Fe concentration was decreased to 0.08% by mass or less, and good platability was obtained. Furthermore, the Fe concentration of the copper sulfate solution was 0.08% by mass or less, and further 0.02% by mass or less, and thus good platability was obtained. In Comparative Example 1 with cooling to 0° C. at a too large cooling rate, on the other hand, the recovery ratio was as high as approximately 70%, but Fe was not reduced, and good platability was not obtained. In Comparative Examples 2 and 3, copper films were formed under the same conditions as in Example 1 by using copper sulfate By using a plating solution having the aforementioned composition, wiring formation on a semiconductor wafer, particularly a semiconductor wafer having a through silicon via, can be performed. Furthermore, by using a plating solution having a composition other than as described above, for example a known composition, such as the composition described in Japanese Patent No. 5,388,191, wiring formation on a semiconductor wafer and wiring formation on a semiconductor circuit board can be performed. Accordingly, by using a plating solution having the aforementioned composition, an integrated circuit and a semiconductor circuit board, such as a package board having the integrated circuit mounted, can be formed.

What is claimed is:

1. Copper sulfate comprising a Fe with a concentration of 0.08 ppm by mass or less.

2. The copper sulfate according to claim 1, wherein the copper sulfate further comprises any one, any two, any three, any four, or five of the following items (3-1) to (3-5):
   (3-1) an in with a concentration of 1.0 ppm by mass or less,
   (3-2) a TI with a concentration of 0.05 ppm by mass or less,
   (3-3) a Sn with a concentration of 1.0 ppm by mass or less,
   (3-4) an Ag with a concentration of 1.0 ppm by mass or less, and
   (3-5) an Al with a concentration of 0.2 ppm by mass or less.

3. The copper sulfate according to claim 1, wherein the copper sulfate further comprises any one, any two, any three, any four, or five of the following items (5-1) to (5-5):
   (5-1) an In with a concentration of 0.2 ppm by mass or less,
   (5-2) a TI with a concentration of 0.05 ppm by mass or less,
   (5-3) a Sn with a concentration of 0.2 ppm by mass or less,
   (5-4) an Ag with a concentration of 0.3 ppm by mass or less, and
   (5-5) an Al with a concentration of 0.1 ppm by mass or less.

4. The copper sulfate according to claim 1, wherein the copper sulfate further comprises any one, any two, any three, any four, or five of the following items (7-1) to (7-5):
   (7-1) an In with a concentration of 0.2 ppm by mass or less,
   (7-2) a TI with a concentration of 0.05 ppm by mass or less,
   (7-3) a Sn with a concentration of 0.2 ppm by mass or less,
   (7-4) an Ag with a concentration of 0.045 ppm by mass or less, and
   (7-5) an Al with a concentration of 0.05 ppm by mass or less.

5. The copper sulfate according to claim 1, wherein the copper sulfate has a concentration of copper sulfate of between 99.9% by mass or more and 99.999% by mass or less.

6. The copper sulfate according to claim 5, wherein the copper sulfate has a concentration of copper sulfate of 99.995% by mass or less.

7. The copper sulfate according to claim 1, wherein the copper sulfate has a concentration of copper sulfate of between 99.9% by mass or more and 99.99% by mass or less and a concentration of metal impurities other than Cu of 30 ppm by mass or less in total.

8. The copper sulfate according to claim 1, wherein the copper sulfate has a total organic carbon concentration of 10 ppm by mass or less.

9. A copper sulfate solution comprising the copper sulfate according to claim 1.

* * * * *